(12) United States Patent
Tsuru et al.

(10) Patent No.: US 9,680,320 B2
(45) Date of Patent: Jun. 13, 2017

(54) BATTERY CONTROL APPARATUS

(75) Inventors: Kenichiro Tsuru, Hitachinaka (JP); Akinori Tada, Hitachinaka (JP); Hiroshi Morikawa, Hitachinaka (JP); Keiichiro Ohkawa, Hitachinaka (JP); Yoshinori Aoshima, Hitachinaka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 151 days.

(21) Appl. No.: 14/118,067

(22) PCT Filed: May 16, 2011

(86) PCT No.: PCT/JP2011/061190
§ 371 (c)(1),
(2), (4) Date: Dec. 30, 2013

(87) PCT Pub. No.: WO2012/157065
PCT Pub. Date: Nov. 22, 2012

(65) Prior Publication Data
US 2014/0184169 A1    Jul. 3, 2014

(51) Int. Cl.
| | |
|---|---|
| H02J 7/00 | (2006.01) |
| G01R 31/36 | (2006.01) |
| B60L 3/00 | (2006.01) |
| B60L 3/04 | (2006.01) |
| B60L 11/18 | (2006.01) |
| H01M 10/42 | (2006.01) |
| H01M 10/48 | (2006.01) |

(52) U.S. Cl.
CPC .......... *H02J 7/0063* (2013.01); *B60L 3/0046* (2013.01); *B60L 3/04* (2013.01); *B60L 11/1864* (2013.01); *G01R 31/362* (2013.01); *H01M 10/425* (2013.01); *H01M 10/48* (2013.01); *H02J 7/0026* (2013.01); *B60L 2240/547* (2013.01); *G01R 31/3658* (2013.01); *H01M 2010/4271* (2013.01); *Y02T 10/7005* (2013.01); *Y02T 10/7011* (2013.01); *Y02T 10/7016* (2013.01); *Y02T 10/7061* (2013.01)

(58) Field of Classification Search
CPC .............................. H02J 7/0063; G01R 31/362
USPC ........................................................ 320/136
See application file for complete search history.

(56) References Cited

U.S. PATENT DOCUMENTS

| | | | | |
|---|---|---|---|---|
| 6,133,707 | A * | 10/2000 | Kikuchi et al. | 320/104 |
| 6,456,042 | B1 * | 9/2002 | Kwok | 320/134 |
| 6,960,899 | B2 * | 11/2005 | Kobayashi et al. | 320/136 |
| 7,719,238 | B2 * | 5/2010 | Iida et al. | 320/151 |

(Continued)

FOREIGN PATENT DOCUMENTS

| | | |
|---|---|---|
| JP | 2004-266917 A | 9/2004 |
| JP | 2007-165211 A | 6/2007 |

(Continued)

*Primary Examiner* — Edward Tso
*Assistant Examiner* — Dung V Bui
(74) *Attorney, Agent, or Firm* — Volpe and Koenig, P.C.

(57) ABSTRACT

A battery control apparatus is provided which can keep an inter-terminal voltage of each single cell within a permitted range while permitted power is controlled in units of a battery pack. The battery control apparatus of the invention restricts the permitted power of the battery pack according to a degree of closeness of a close circuit voltage of the single cell to an upper limit or a lower limit of the permitted range.

12 Claims, 6 Drawing Sheets

(56) References Cited

U.S. PATENT DOCUMENTS

| | | | |
|---|---|---|---|
| 2004/0008031 A1* | 1/2004 | Arai et al. | 324/429 |
| 2005/0048335 A1* | 3/2005 | Fields et al. | 429/22 |
| 2008/0036424 A1* | 2/2008 | Saigo | 320/136 |
| 2009/0230917 A1* | 9/2009 | Kojima et al. | 320/101 |
| 2010/0261048 A1* | 10/2010 | Kim et al. | 429/150 |
| 2010/0318252 A1* | 12/2010 | Izumi | 701/22 |
| 2014/0184169 A1* | 7/2014 | Tsuru et al. | 320/136 |

FOREIGN PATENT DOCUMENTS

| | | |
|---|---|---|
| JP | 2008-104289 A | 5/2008 |
| WO | 2008/111594 A1 | 9/2008 |
| WO | 2011/027449 A1 | 3/2011 |

* cited by examiner

| SINGLE CELL No | MAXIMUM CCV RANGE |
|---|---|
| 1 | 4.0V~4.4V |
| 2 | 4.0V~4.4V |
| ... | ... |

173

| SINGLE CELL No | MINIMUM CCV RANGE |
|---|---|
| 1 | 2.6V~3.0V |
| 2 | 2.6V~3.0V |
| ... | ... |

BATTERY CONTROL APPARATUS

TECHNICAL FIELD

The present invention relates to an apparatus for controlling a battery.

BACKGROUND ART

A vehicle running by using electricity as a driving force is mounted with a storage battery such as a lead-acid battery, a nickel hydrogen battery or a lithium ion battery. The electric power required when a hybrid vehicle or an electric vehicle is supplied by the storage battery.

The permitted charge power and discharge power of the storage battery respectively vary according to the state of charge. If charging or discharging over the maximum permitted power is performed, overcharging or overdischarging can occur. As the state of charge (SOC) of the storage battery becomes high, the maximum permitted charge power decreases and the maximum permitted discharge power increases. Alternatively, as the SOC of the storage battery becomes low, the maximum permitted discharge power decreases and the permitted charge power increases. In order to safely use the storage battery, the charging and discharging control is required to be performed within a range not exceeding the maximum permitted power.

PTL 1 mentioned below discloses a technique in which, even when a temperature variation occurs among single cells constituting a battery pack, permitted charge and discharge powers suitable for respective single cells are calculated, and charging and discharging control is optimally performed.

PTL 2 mentioned below discloses a method in which a maximum cell voltage value and a minimum cell voltage value are detected, maximum charge power is determined by using the maximum cell voltage value, and maximum discharge power is determined by using the minimum cell voltage value.

CITATION LIST

Patent Literature

PTL 1: JP-A-2007-165211
PTL 22: JP-A-2004-266917

SUMMARY OF INVENTION

Technical Problem

In the technique disclosed in Patent Literature 1, the permitted charge and discharge powers are obtained at each of the highest temperature Tmax and the lowest temperature Tmin of the storage battery 10, and smaller values are used. In this method, since the position where the temperature sensor is disposed does not necessarily correspond to each of the single cells, there is a possibility that the temperature detected by the temperature sensor does not necessarily accurately correspond to the permitted charge and discharge powers of each of the single cells. Accordingly, there is a possibility that the inter-terminal voltage of each of the single cells exceeds the permitted range.

Patent Literature 1 also discloses that the state of charge of each single cell is acquired, and the charging and discharging management is performed in view of variation in the state of charge of the single cell. However, the control process for managing the state of charge of each single cell becomes complicated, and the cost can become high. The technique disclosed in Patent Literature 2 has also the same problems.

The invention is made in order to solve the foregoing problem, and has an object to provide a battery control apparatus which can keep an inter-terminal voltage of each single cell within a permitted range while permitted power is controlled in units of a battery pack.

Solution to Problem

The battery control apparatus of the invention restricts permitted power of a battery pack according to a degree of closeness of a close circuit voltage (CCV) of a single cell to an upper limit or a lower limit of a permitted range.

Advantageous Effects of Invention

According to the battery control apparatus of the invention, when the CCV of the single cell approaches the upper limit or the lower limit of the permitted range, permitted power is suppressed to prevent exceeding this, so that the single cell can be protected. Besides, since the permitted power of the battery pack is directly controlled, the control is performed in units of a battery pack, and the load of the control process can be reduced.

DESCRIPTION OF EMBODIMENTS

In embodiments described below, although a battery pack is constructed by connecting single cells in series, the battery pack may be constructed by connecting parallel-connected single cells in parallel, or may be constructed by connecting series-connected single cells in parallel.

<Embodiment 1: Apparatus Structure>

Figure 1:
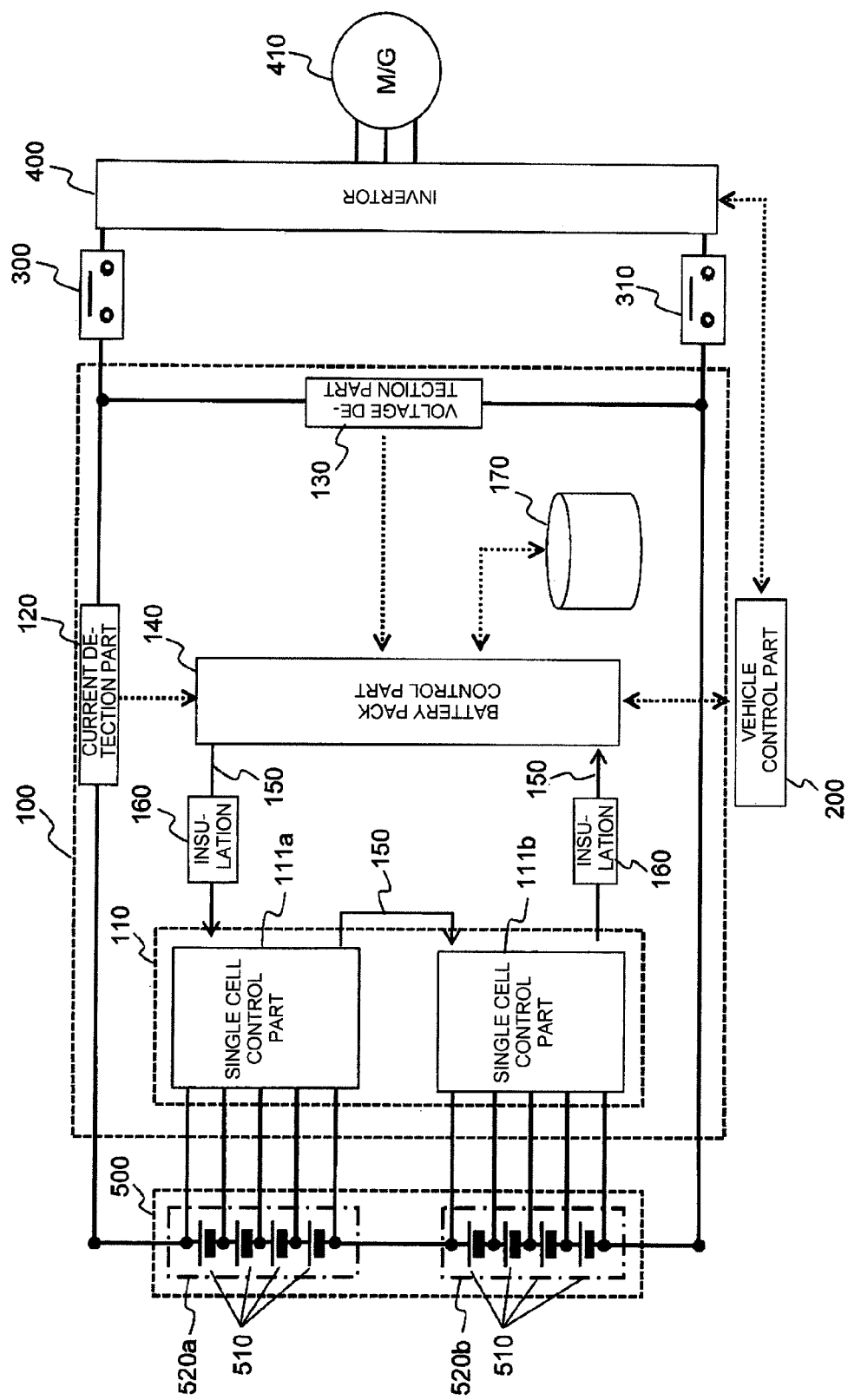
FIG. 1 is a view showing a battery control apparatus 100 of embodiment 1 and its peripheral circuit structure.

FIG. 1 is a view showing a battery control apparatus 100 of embodiment 1 of the invention and its peripheral circuit structure. The battery control apparatus 100 is an apparatus to monitor and control the state of a battery pack 500. The battery control apparatus 100 includes a single cell management part 110, a current detection part 120, a voltage detection part 130, a battery pack control part 140 and a storage part 170.

The battery pack 500 is constructed such that plural single cells 510 each of which can store and discharge electric energy (charging and discharging of DC power) are electrically connected in series. The single cells 510 constituting the battery pack 500 are grouped by a specified number of units for execution of state management and control. The grouped single cells 510 are electrically connected in series, and constitute single cell groups 520a and 520b. The number of single cells 510 constituting the single cell group 520 may be the same in all the single cell groups 520, or the number of single cells 510 may be different among the single cell groups 520.

The single cell management part 110 monitors the states of the single cells 510 constituting the battery pack 500. The single cell management part 110 includes a single cell control part 111 provided for each of the single cell groups 520. In FIG. 1, the single cell control parts 111a and 111b are provided correspondingly to the single cell groups 520a and 520b. The single cell control part 111 monitors and controls the states of the single cells 510 constituting the single cell group 520.

In the embodiment 1, for simplifying the explanation, the four single cells 510 are electrically connected in series to constitute each of the single cell groups 520a and 520b, and the single cell groups 520a and 520b are further electrically connected in series. Thus, the battery pack 500 includes the eight single cells 510 in total.

The battery pack control part 140 and the single cell management part 110 transmit and receive signals through insulation elements 160 typified by a photocoupler and signal communication units 150.

A communication unit between the battery pack control part 140 and the single cell control parts 111a and 111b constituting the single cell management part 110 will be described. The single cell control parts 111a and 111b are connected in series in ascending order of potential of the single cell groups 520a and 520b respectively monitored by them. A signal transmitted from the battery pack control part 140 to the single cell management part 110 is inputted to the single cell control part 111a through the insulation element 160 and the signal communication unit 150. The output of the single cell control part 111a is inputted to the single cell control part 111b through the signal communication unit 150. The output of the lowest-level single cell control part 111b is transmitted to the battery pack control part 140 through the insulation element 160 and the signal communication unit 150. In the embodiment 1, although the insulation element 160 does not intervene between the single cell control part 111a and the single cell control part 111b, a signal can also be transmitted and received through the insulation element 160.

The battery pack control part 140 performs the state detection of the single cell 510, the single cell group 520 or the battery pack 500 based on the information transmitted by the single cell management part 110, the current value inputted to and outputted from the battery pack 500, which is transmitted by the current detection part 120, the total voltage value of the battery pack 500 transmitted by the voltage detection part 130, the information previously stored in the storage part 170, and the like.

The information output by the single cell management part 110 to the battery pack control part 140 includes the measurement value of the voltage and temperature of the single cell 510, and abnormal information of the single cell 510 such as overcharging, overdischarging or over temperature of the single cell 510. Further, the single cell management part 110 may output also a communication error of the single cell management part 110 itself or the single cell control part 111, and an abnormal signal in the case of physical failure typified by breaking of a harness to the battery pack control part 140. In this case, the battery pack control part 140 can perform the charging and discharging control of the battery pack 500 in view of the abnormal contents of the single cell management part 110 or the single cell control part 111.

The information stored in the storage part 170 includes internal resistance characteristics of the battery pack 500, the single cell 510 and the single cell group 520, capacity at full charge, polarization voltage, deterioration characteristics, individual difference information, and correspondence relation between SOC and open circuit voltage (OCV). Further, characteristic information of the single cell management part 110, the single cell control part 111, the battery pack control part 140 and the like can also be previously stored. The information stored in the storage part 170 will be again described with reference to after-mentioned FIG. 3 to FIG. 5.

The battery pack control part 140 carries out an operation required to manage SOC of at least one single cell 510, state of health (SOH), current and power capable of being inputted and outputted, abnormal state, and the like based on the measurement values and the information stored in the storage part 170. Then, based on the operation result, information is output to the single cell management part 110 and a vehicle control part 200.

The vehicle control part 200 is a control apparatus superordinate to the battery pack control part 140, and connects the battery control apparatus 100 and an invertor 400 through relays 300 and 310 and based on the information transmitted by the battery pack control part 140. The vehicle control part 200 can issue an instruction to the battery pack control part 140 when necessary, and the battery pack control part 140 may start the process based on the instruction from the vehicle control part 200.

When a vehicle system mounted with the battery control apparatus 100 starts and runs, the battery control apparatus 100 is connected to the invertor 400 under management of the vehicle control part 200, and drives a motor generator 410 by using energy stored in the battery pack 500. At the time of regeneration, the battery pack 500 is charged by power generated by the motor generator 410.

Figure 2:
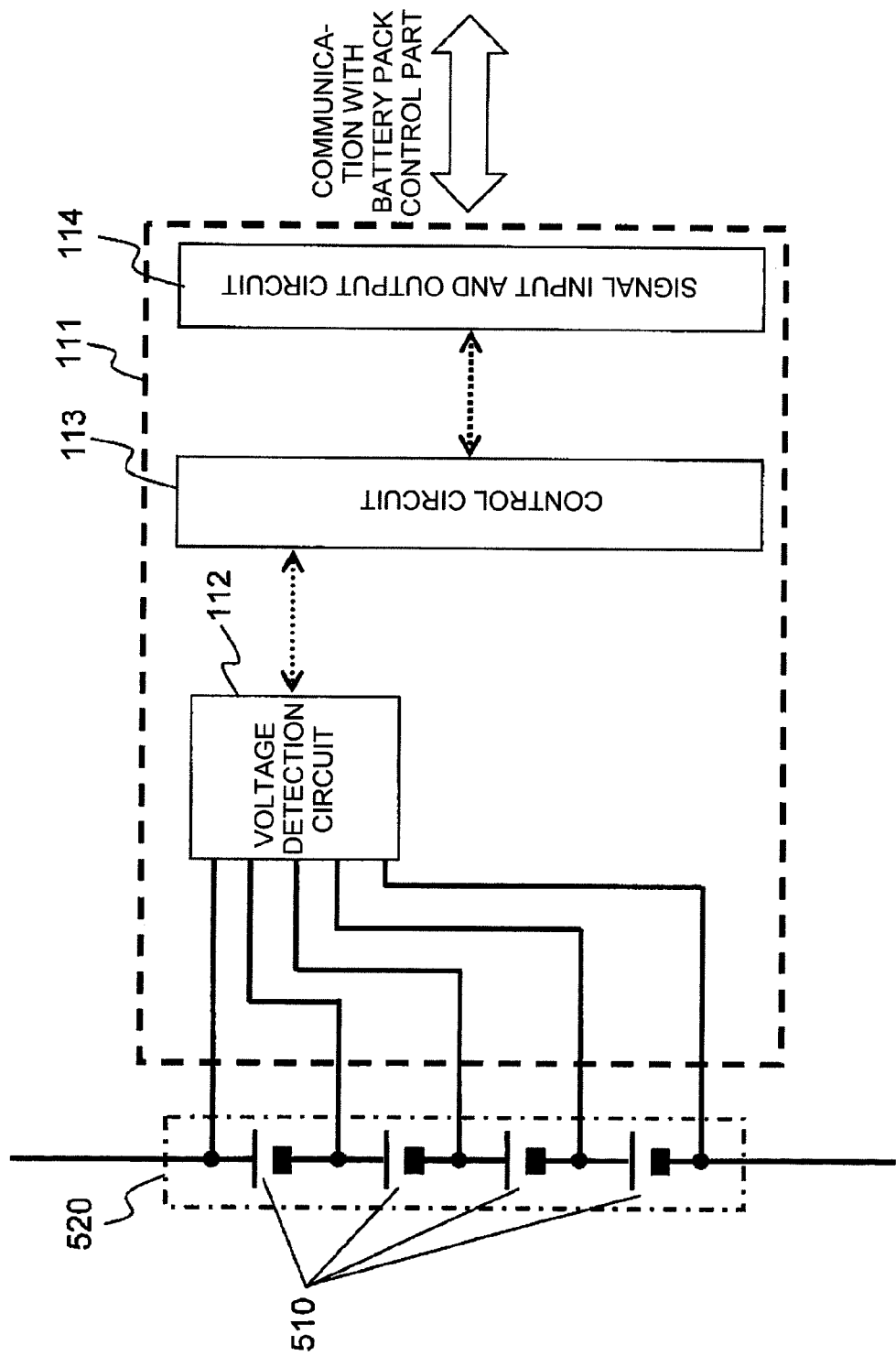
FIG. 2 is a view showing a circuit structure of a single cell control part 111.

FIG. 2 is a view showing a circuit structure of the single cell control part 111. The single cell control part 111 includes a voltage detection circuit 112, a control circuit 113 and a signal input and output circuit 114. The voltage detection circuit 112 measures the inter-terminal voltage of each of the single cells 510. The control circuit 113 receives the measurement result from the voltage detection circuit 112, and transmits it to the battery pack control part 140 through the signal input and output circuit 114. Besides, the control circuit controls a charging operation and a discharging operation of each of the single cells 510. Since a circuit structure of the charging operation and the discharging operation is well known, its description is omitted.

Figure 3:
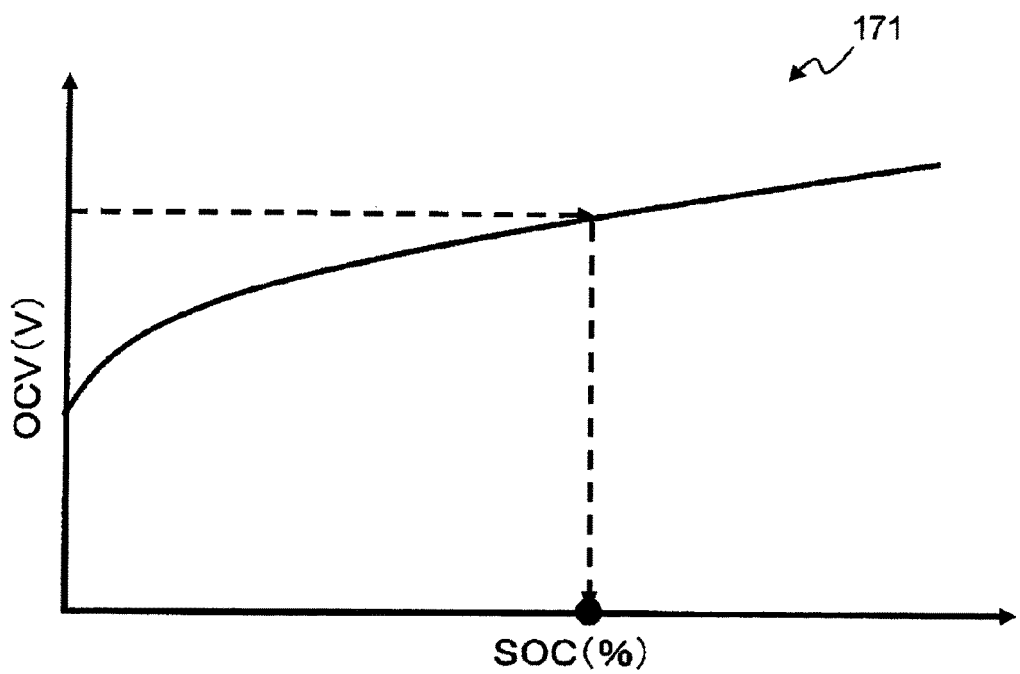
FIG. 3 is a view showing an example of an SOC table 171 stored in a storage part 170.

FIG. 3 is a view showing an example of an SOC table 171 stored in the storage part 170. The SOC table 171 is a data table describing a correspondence relation between OCV of the battery pack 500 and SOC of the battery pack 500. Although the data format may be arbitrary, for convenience of explanation, here, the data example is shown in graph format.

The OCV is a voltage at the time of no load of the battery pack 500. The OCV can be acquired when the inter-terminal voltage of the single cell 510 is acquired at the timing before the relays 300 and 310 are closed or in the state where charging and discharging of the battery pack 500 is not started although the relays 300 and 310 are closed. The battery pack control part 140 integrates the OCV of the single cell 510 detected by the single cell control part 111 to obtain the OCV of the battery pack 500, and can obtain the SOC of the battery pack 500 by using the OCV of the battery pack 500 and the SOC table 171. Further, during the charging and discharging of the battery pack 500, the OCV is obtained by removing an internal resistance component and a polarization voltage component from the CCV, and the SOC of the battery pack 500 can be similarly obtained.

Figure 4:
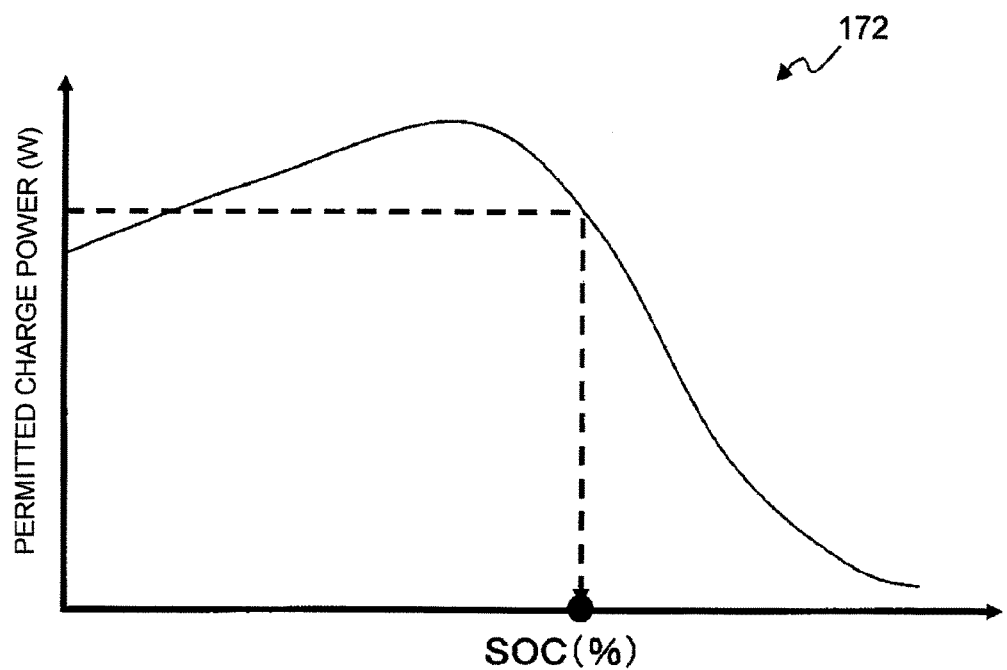
FIG. 4 is a view showing an example of a permitted charge power table 172 stored in the storage part 170.

FIG. 4 is a view showing an example of a permitted charge power table 172 stored in the storage part 170. The permitted charge power table 172 is a data table describing a correspondence relation between the SOC of the battery pack 500 and the permitted charge power. Although the data format may be arbitrary, for convenience of explanation, here, the data example is shown in graph format. Values of the permitted charge power table 172 are previously obtained by, for example, calculation and can be stored in the storage part 170.

The battery pack control part 140 can acquire the permitted charge power of the battery pack 500 by using the SOC of the battery pack 500 acquired by using the SOC table 171 and the permitted charge power table 172.

Figures 5, 6:
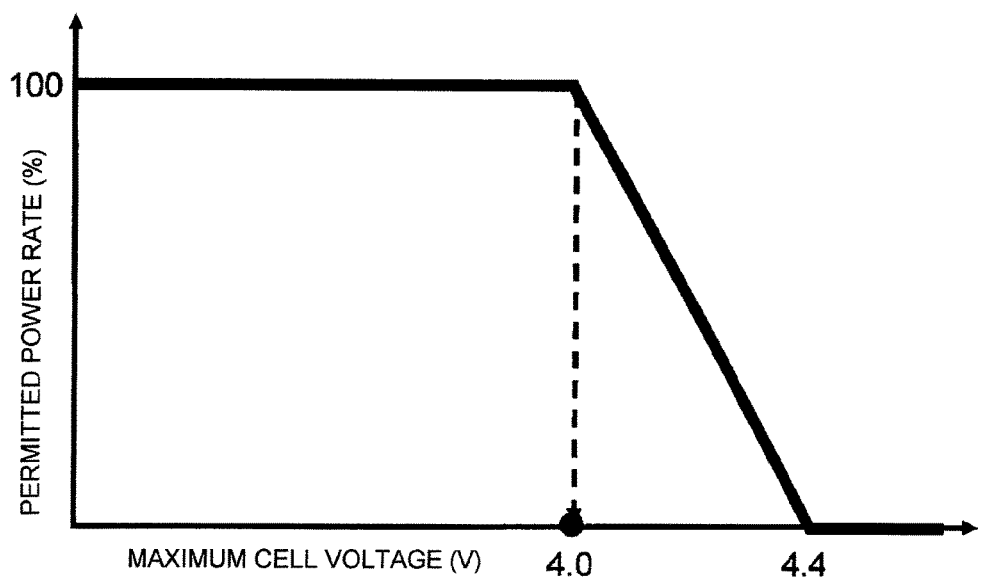
FIG. 5 is a view showing an example of a maximum CCV range data stored in the storage part 170.
FIG. 6 is a view showing a situation in which the battery control apparatus 100 of embodiment 1 adjusts permitted charge power of the whole battery pack 500 in order to control inter-terminal voltage of each single cell 510.

FIG. 5 is a view showing an example of maximum CCV range data 173 stored in the storage part 170. The maximum CCV range data 173 is data describing a range of the maximum value of CCV of each of the single cells 510, within which the permitted power is restricted. The same value may be used for all the single cells 510, or different values may be used according to the characteristic of each of the single cells 510.

When the battery pack 500 is charged, there is an upper limit for permitted charge power. Correspondingly to this, a range of maximum CCV of the single cell 510 is set within which the permitted power is restricted. The maximum CCV range data 173 is the data describing this range.

In the above, the structure of the battery control apparatus 100 is described. Next, with respect to the operation of the battery control apparatus 100, a basic concept and an operation procedure will be described.

<Embodiment 1: Concept of Apparatus Operation>

Even when the whole battery pack 500 operates within the range of rated voltage, each of the single cells 510 can exceed the rated voltage. When the battery pack 500 is charged, in order to keep the inter-terminal voltage of each of the single cells within the rated voltage, the charge power to each of the single cells 510 is required to be individually controlled, or the permitted charge power of the whole battery pack 500 is suppressed to be sufficiently low so that the inter-terminal voltage of each of the single cells 510 falls within the rated voltage.

With respect to the method of individually controlling the charge power to each of the single cells 510, such a problem is conceivable that the control process becomes complicated and the cost becomes high. Thus, in the embodiment 1, an attempt is made to keep the inter-terminal voltage of each of the single cells 510 within the rated voltage by suppressing the permitted charge power of the whole battery pack 500 to be sufficiently low.

Specifically, a range of the inter-terminal voltage of each of the single cells 510 is previously determined within which the permitted power is restricted. When the inter-terminal voltage of the single cell 510 is close to the lower limit value of this range, a larger charge power is permitted, and when the inter-terminal voltage is close to the upper limit value, the charge power is suppressed to be low.

FIG. 6 is a view showing a situation in which the battery control apparatus 100 of the embodiment 1 adjusts the permitted charge power of the whole battery pack 500 in order to control the inter-terminal voltage of each of the single cells 510. The values described in the maximum CCV range data 173 are used for the range of the inter-terminal voltage of each of the single cells 510, within which the permitted power is restricted. Here, 4.0 V to 4.4 V exemplified in FIG. 5 was used.

When the inter-terminal voltage of the single cell 510 is close to the lower limit value (4.0 V) of the range within which the permitted power is restricted, a larger charge power can be permitted. Accordingly, the permitted charge power is increased. When the inter-terminal voltage of the single cell 510 is coincident with the lower limit value (4.0 V) of the permitted range, 100% of the permitted charge power obtained from the permitted charge power table 172 is used.

On the other hand, when the inter-terminal voltage of the single cell 510 is close to the upper limit value (4.4 V) of the range within which the permitted power is restricted, a large charge power can not be permitted. Accordingly, the permitted charge power is decreased. When the inter-terminal voltage of the single cell 510 is coincident with the upper limit value (4.4 V) of the permitted range, the supply of the charge power to the single cell 510 is not permitted.

The above relation is shown in graph as in FIG. 6. That is, the case where the inter-terminal voltage of the single cell 510 is coincident with the lower limit value (4.0 V) of the range of restricting the permitted power is made 100%. As the inter-terminal voltage of the single cell 510 approaches the upper limit value (4.4 V) of the range of restricting the permitted power, the permitted charge power is decreased. In the section between the lower limit value (4.0 V) and the upper limit value (4.4 V) of the permitted range, for example, linear interpolation may be performed by proportional calculation, or the permitted charge power in the section may be described in data such as the maximum CCV range data 173.

Incidentally, when the inter-terminal voltages of the respective single cells 510 are different from one another other, from the viewpoint of operation safety, it is desirable that a maximum one of the inter-terminal voltages of the respective single cells 510 is made a reference, and the permitted charge power is obtained.

<Embodiment 1: Operation Procedure of Apparatus>

In the following, a description will be made on an operation procedure of keeping the inter-terminal voltage of each of the single cells 510 within the range described in the maximum CCV range data 173 when the battery control apparatus 100 causes the battery pack 500 to be charged.

(Step 1: Acquire CCV of the Single Cell 510 and the Battery Pack 500)

The battery pack control part 140 instructs the single cell management part 110 to acquire the CCV of the single cell 510. The single cell control part 111 acquires the detection result of the voltage detection circuit 112, and outputs the detection result to the battery pack control part 140. The battery pack control part 140 acquires the CCV of the whole battery pack 500 from the voltage detection part 130.

(Step 1: Supplement)

When the CCV of the single cell 510 is acquired at this step, a maximum one of the CCVs of the respective single cells 510 may be acquired from the viewpoint of operation safety.

(Step 2: Acquire SOC of the Battery Pack 500)

The battery pack control part 140 uses the CCV calculated from the CCV of the battery pack 500 acquired at step 1 and the SOC table 171, and acquires the SOC of the battery pack 500.

(Step 3: Acquire Permitted Charge Power of the Battery Pack 500)

The battery pack control part 140 uses the SOC of the battery pack 500 acquired at step 2 and the permitted charge power table 172, and acquires the permitted charge power of the battery pack 500.

(Step 4: Acquire Permitted Power Restricted Range of CCV of the Single Cell 510)

The battery pack control part 140 acquires the permitted power restricted range of the CCV of the single cell 510 from the maximum CCV range data 173. When the permitted power restricted ranges of the CCVs of the respective single cells 510 are not equal to each other, the permitted power restricted range of the CCV of the single cell having the lowest rated voltage may be selected for safety.

(Step 5: Obtain rate of restricting the permitted charge power)

The battery pack control part 140 acquires a degree of closeness of the CCV of the single cell 510 acquired at step 1 to the upper limit value of the permitted power restricted range acquired at step 4, and obtains the rate of restricting the permitted charge power based on this. As a method of obtaining the rate of restricting the permitted charge power, following examples are conceivable.

(Step 5: Example of Calculating the Restriction Rate: No. 1)

It is assumed that the CCV of the single cell 510 is 4.2 V, and the permitted power restricted range of the CCV is 4.0 V to 4.4 V. When the linear interpolation as exemplified in FIG. 6 is used, it is understood that the permitted charge power should be suppressed to 50%.

(Step 5: Example of Calculating the Restriction Rate: No. 2)

It is assumed that the permitted power restricted range of the CCV is 4.0 to 4.4 V. When the CCV of the single cell 510 is the center value (4.2 V) or higher, the permitted amount is decreased (permitted rate=30%), and when the CCV of the single cell 510 is less than the center value (4.2 V), the permitted amount is increased (permitted rate=80%).

(Step 5: Supplement No. 1)

When the CCV of the single cell 510 acquired at step 1 is lower than the lower limit value of the permitted power restricted range acquired at step 4, charging may be performed at the maximum charge power (permitted rate=100%).

(Step 5: Supplement No. 2)

When the CCV of the single cell 510 acquired at step 1 is higher than the upper limit value of the permitted power restricted range acquired at step 4, charging may not be permitted (permitted rate=0%), or an alarm may be given to a higher-level control apparatus (for example, the vehicle control part 200).

(Step 6: Restrict Permitted Charge Power)

The battery pack control part 140 restricts the permitted charge power in accordance with the rate obtained at step 5. When the battery pack control part 140 itself has the function to limit the permitted charge power, this may performed by itself. Alternatively, a higher-level control apparatus (for example, the vehicle control part 200) may be notified to restrict the permitted charge power.

<Embodiment 1: Conclusion>

As described above, the battery control apparatus 100 of the embodiment 1 restricts the permitted charge power of the battery pack 500 according to the degree of closeness of the CCV of the single cell 510 to the upper limit of the permitted power restricted range. By this, the charge power is restricted before the inter-terminal voltage of the single cell 510 exceeds the permitted range and the single cell 510 can be protected.

Besides, the battery control apparatus 100 of the embodiment 1 performs the control process to keep the inter-terminal voltage of the single cell 510 within the permitted range in units of the battery pack 500. By this, since the control process can be simplified, this is advantageous from the viewpoint of calculation load and the like.

<Embodiment 2>

In the embodiment 1, the example is described in which the single cell 510 is protected by restricting the permitted charge power. The same method can be used also in an operation at the time of discharging. Then, in embodiment 2 of the invention, a method of restricting permitted discharge power will be described. Since a structure of a battery control apparatus 100 and its peripheral circuit is substantially the same as that of the embodiment 1, different points will be mainly described below.

<Embodiment 2: Apparatus Structure>

Figures 7, 8:
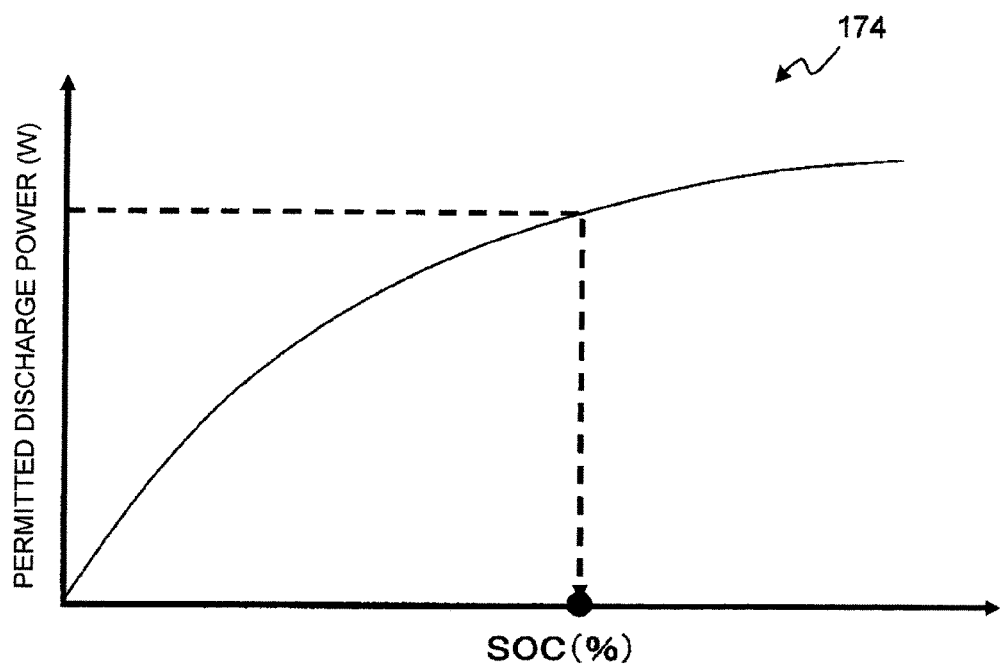
FIG. 7 is a view showing an example of a permitted discharge power table 174 stored in a storage part 170 in embodiment 2.
FIG. 8 is a view showing an example of minimum CCV range data 175 stored in the storage part 170 in embodiment 2.

FIG. 7 is a view showing an example of a permitted discharge power table 174 stored in the storage part 170. The permitted discharge power table 174 is a data table describing a correspondence relation between SOC of the battery pack 500 and permitted discharge power. Although a data format may be arbitrary, for convenience of explanation, here, the data example is shown in graph format. Values of the permitted discharge power table 174 are previously obtained by, for example, calculation, and can be stored in the storage part 170.

The battery pack control part 140 uses the SOC of the battery pack 500 acquired by using the SOC table 171 and the permitted discharge power table 174 and can acquire the permitted discharge power of the battery pack 500.

FIG. 8 is a view showing an example of minimum CCV range data 175 stored in the storage part 170. The minimum CCV range data 175 is data describing a range of the minimum value of CCV of each of the single cells 510, within which the permitted power is restricted. The same value may be used for all the single cells 510, or different values may be used according to the characteristics of the respective single cells 510.

When the battery pack 500 is discharged, there is a lower limit of permitted discharge power. Correspondingly to this, a range of minimum CCV of the single cell 510 is set within which the permitted power is restricted. The minimum CCV range data 175 is the data describing this range.

In the above, the structure of the battery control apparatus 100 is described. Next, with respect to the operation of the battery control apparatus 100, a basic concept and an operation procedure will be described.

<Embodiment 2: Concept of Apparatus Operation>

When the battery pack 500 is discharged, it is presumed that a certain degree of charge is charged in each of the single cells 510. When a charge amount is insufficient, a desired discharge amount can not be obtained. Then, in the embodiment 2, the permitted range of the inter-terminal voltage of each of the single cells 510 is previously determined. When the inter-terminal voltage of the single cell 510 is close to the lower limit value of the range, discharge power is suppressed to be low, and when the inter-terminal voltage is close to the upper limit value, larger discharge power is permitted.

Figure 9:
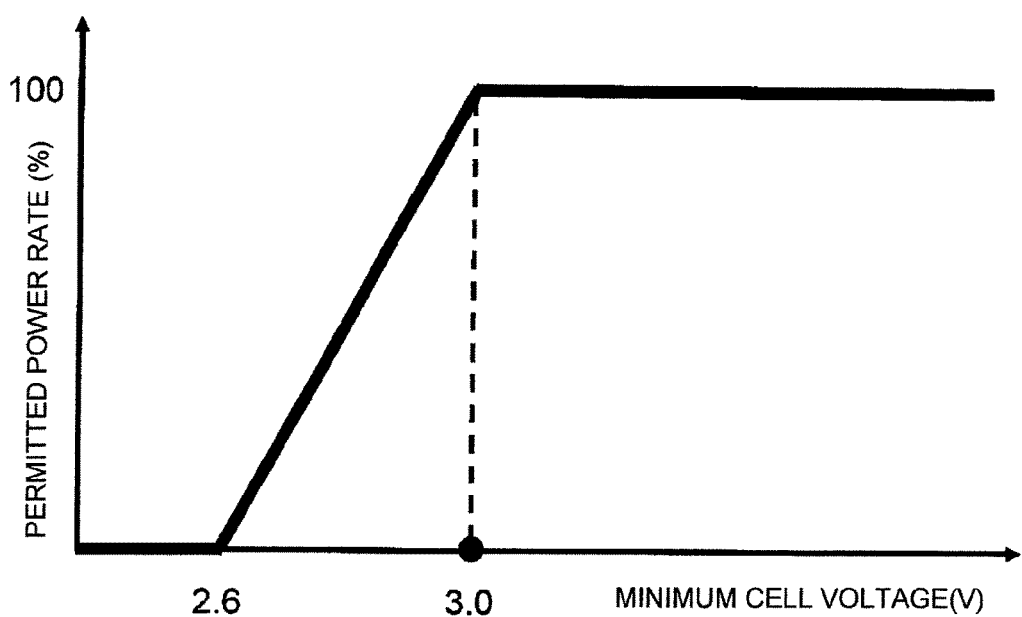
FIG. 9 is a view showing a situation in which a battery control apparatus 100 of embodiment 2 adjusts permitted discharge power of the whole battery pack 500 in order to control inter-terminal voltage of each single cell 510.

FIG. 9 is a view showing a situation in which the battery control apparatus 100 of the embodiment 2 adjusts the permitted discharge power of the whole battery pack 500 in order to control the inter-terminal voltage of each of the single cells 510. The values described in the minimum CCV range data 175 are used for the permitted range of the inter-terminal voltage of each of the single cells 510. Here, 2.6 V to 3.0 V exemplified in FIG. 8 was used.

When the inter-terminal voltage of the single cell 510 is close to the lower limit value (2.6 V) of the permitted range, since large discharge power can not be permitted, the permitted discharge power is decreased. When the inter-terminal voltage of the single cell 510 is not larger than the lower limit value (2.6 V) of the permitted range, discharging of the battery pack 500 is not permitted.

On the other hand, when the inter-terminal voltage of the single cell 510 is close to the upper limit value (3.0 V), since larger discharge power can be permitted, the permitted discharge power is increased. When the inter-terminal voltage of the single cell 510 is not lower than the upper limit value (3.0 V), 100% of the permitted discharge power obtained from the permitted discharge power table 174 is used.

The above relation is shown in graph as in FIG. 9. That is, the case where the inter-terminal voltage of the single cell 510 is coincident with the upper limit value (3.0 V) of the permitted range is made 100%. As the inter-terminal voltage of the single cell 510 approaches the lower limit value (2.6 V) of the permitted range, the permitted discharge power is decreased. In the section between the lower limit value (2.6V) and the upper limit value (3.0V) of the permitted range, for example, linear interpolation may be performed by proportional calculation, or the permitted discharge power in the section may be described in data such as the minimum CCV range data 175.

Incidentally, when the inter-terminal voltages of the respective single cells 510 are different from one another, from the viewpoint of operation safety, it is desirable that a minimum one of the inter-terminal voltages of the single cells 510 is made a reference, and the permitted discharge power is obtained.

<Embodiment 2: Operation Procedure of Apparatus>

In the following, a description will be made on an operation procedure to keep the inter-terminal voltage of the single cell 510 within the range described in the minimum CCV range data 175 when the battery control apparatus 100 causes the battery pack 500 to be discharged.

(Step 1 to Step 2)

These steps are the same as step 1 to step 2 described in the embodiment 1.

(Step 3: Obtain Permitted Discharge Power of the Battery Pack 500)

The battery pack control part 140 uses the SOC of the battery pack 500 acquired at step 2 and the permitted discharge power table 174 and acquires the permitted discharge power of the battery pack 500.

(Step 4: Acquire Permitted Power Restricted Range of CCV of the Single Cell 510)

The battery pack control part 140 acquires the permitted power restricted range of CCV of the single cell 510 from the minimum CCV range data 175.

(Step 5: Obtain Rate of Restricting Permitted Discharge Power)

The battery pack control part 140 acquires a degree of closeness of the CCV of the single cell 510 acquired at step 1 to the lower limit value of the permitted power restricted range acquired at step 4, and obtains the rate of restricting the permitted discharge power based on this. A method of obtaining the rate of restricting the permitted discharge power may be the same as that of the embodiment 1.

(Step 5: Supplement No. 1)

When the CCV of the single cell 510 acquired at step 1 is higher than the upper limit value of the permitted power restricted range acquired at step 4, discharging may be performed at the maximum discharge power (permitted rate=100%).

(Step 5: Supplement No. 2)

When the CCV of the single cell 510 acquired at step 1 is lower than the lower limit value of the permitted power restricted range acquired at step 4, discharging may not be permitted to be performed (permitted rate=0%), or an alarm may be given to a higher-level control apparatus (for example, the vehicle control part 200).

(Step 6: Restrict permitted discharge power)

The battery pack control part 140 restricts the permitted discharge power in accordance with the rate obtained at step 5. When the battery pack control part 140 itself has the function to control the permitted charge power, this may be performed by itself. Alternatively, a higher-level control apparatus (for example, the vehicle control part 200) may be notified to restrict the permitted discharge power.

<Embodiment 2: Conclusion>

As described above, the battery control apparatus 100 of the embodiment 2 restricts the permitted discharge power of the battery pack 500 in accordance with the degree of closeness of the CCV of the single cell 510 to the lower limit value of the permitted power restricted range. By this, the discharge power is restricted before the inter-terminal voltage of the single cell 510 exceeds the permitted power restricted range, and an appropriate discharge amount can be obtained.

Incidentally, it is needless to say that the charge control method described in the embodiment 1 and the discharge control method described in the embodiment 2 are combined, and the optimum control can be performed both at the time of charge and discharge.

<Embodiment 3>

Although the SOC of the battery pack 500 is obtained by using the SOC table 171 in the embodiments 1 to 2, this can be obtained by another method, for example, by use of a specified arithmetic expression. Similarly, although the permitted charge and discharge powers are obtained by using the permitted charge power table 172 and the permitted discharge power table 174 in the embodiments 1 to 2, these can be obtained by another method, for example, by use of a specified arithmetic expression.

In the above, although the invention made by the inventor is specifically described based on the embodiments, it is needless to say that the invention is not limited to the embodiments, and various modifications can be made in the range not departing from the gist.

Besides, the above respective structures, functions and processing parts can be realized as hardware by designing all or part thereof with, for example, an integrated circuit, or can also be realized as software by a program executed by a processor to realize the respective functions. The program to realize the respective functions and the information such as the table can be stored in a storage device such as a memory or a hard disk or a storage medium such as an IC card or a DVD.

REFERENCE SIGNS LIST

100: battery control apparatus, 110: single cell management part, 111: single cell control part, 112: voltage detection circuit, 113: control circuit, 114: signal input and output circuit, 120: current detection part, 130: voltage detection part, 140: battery pack control part, 150: signal communication unit, 160: insulation element, 170: storage part, 171: SOC table, 172: permitted charge power table, 173: maximum CCV range data, 174: permitted discharge power table, 175: minimum CCV range data, 200: vehicle control part, 300 and 310: relay, 400: invertor, 410: motor generator, 500: battery pack, 510: single cell, 520: single cell group.

The invention claimed is:

1. A battery control apparatus comprising:
   a control part to control to a battery pack in which a plurality of single cells are connected;
   a voltage measurement part to measure an inter-terminal voltage of a single cell within the plurality of single cells and an inter-terminal voltage of the battery pack; and
   a storage part to store cell voltage data of a permitted power restricted range describing a range of a close circuit voltage of the single cell within the plurality of single cells within which a permitted power is restricted,
   wherein the control part
      acquires the close circuit voltage of the single cell and the close circuit voltage of the battery pack measured by the voltage measurement part,
      acquires a present permitted power of the battery pack by using the close circuit voltage of the battery pack,
      calculates a rate of restricting the permitted power of the battery pack in accordance with a degree of closeness of the close circuit voltage of the single cell within the plurality of single cells to an upper limit value or a lower limit value of the range described in the permitted cell voltage data, and
      restricts the permitted power of the battery pack in accordance with the rate.

2. The battery control apparatus according to claim 1, wherein
   the permitted cell voltage data describes the permitted range of the close circuit voltage of the single cell within the plurality of single cells when the battery pack is charged,
   and when the battery pack is charged, the control part
      sets the rate not to permit the battery pack to be charged when the close circuit voltage of the single cell within the plurality of single cells is equal to the upper limit value of the range,
      sets the rate to cause the battery pack to be charged at a maximum value of permitted charge power of the battery pack when the close circuit voltage of the single cell within the plurality of single cells is equal to the lower limit value of the range, and
      sets, as the rate, a value between the rate of the case where the close circuit voltage of the single cell within the plurality of single cells is equal to the upper limit value of the range and the rate of the case where the close circuit voltage of the single cell within the plurality of single cells is equal to the lower limit value of the range when the close circuit voltage of the single cell within the plurality of single cells is between the upper limit value and the lower limit value of the range.

3. The battery control apparatus according to claim 2, wherein
   the control part sets the rate to cause the battery pack to be charged at the maximum value of the permitted charge power of the battery pack when the close circuit voltage of the single cell within the plurality of single cells is lower than the lower limit value of the range.

4. The battery control apparatus according to claim 2, wherein the control part sets the rate not to permit the battery pack to be charged when the close circuit voltage of the single cell within the plurality of single cells is higher than the upper limit value of the range.

5. The battery control apparatus according to claim 2, wherein the control part gives an alarm when the close circuit voltage of the single cell within the plurality of single cells is higher than the upper limit value.

6. The battery control apparatus according to claim 1, wherein
   the permitted cell voltage data describes the permitted range of the close circuit voltage of the single cell within the plurality of single cells when the battery pack is discharged,
   and when the battery pack is discharged, the control part
      sets the rate to cause the battery pack to be discharged at a maximum value of permitted discharge power of the battery pack when the close circuit voltage of the single cell within the plurality of single cells is equal to the upper limit value,
      sets the rate not to permit the battery pack to be discharged when the close circuit voltage of the single cell within the plurality of single cells is equal to the lower limit value of the range, and
   sets, as the rate, a value between the rate of the case where the close circuit voltage of the single cell within the plurality of single cells is equal to the upper limit value of the range and the rate of the case where the close circuit voltage of the single cell within the plurality of single cells is equal to the lower limit value of the range when the close circuit voltage of the single cell within the plurality of single cells is between the upper limit value and the lower limit value of the range.

7. The battery control apparatus according to claim 6, wherein the control part sets the rate to cause the battery pack to be discharged at the maximum value of the permitted discharge power of the battery pack when the close circuit voltage of the single cell within the plurality of single cells is higher than the upper limit value of the range.

8. The battery control apparatus according to claim 6, wherein the control part sets the rate not to permit the battery pack to be discharged when the close circuit voltage of the single cell within the plurality of single cells is lower than the lower limit value of the range.

9. The battery control apparatus according to claim 6, wherein the control parts gives an alarm when the close circuit voltage of the single cell within the plurality of single cells is lower than the lower limit value of the range.

10. The battery control apparatus according to claim 1, wherein
   when the close circuit voltage of the single cell within the plurality of single cells is between the upper limit value and the lower limit value of the range,
   the control part calculates a value between the rate of the case where the close circuit voltage of the single cell within the plurality of single cells is equal to the upper limit value and the rate of the case where the close circuit voltage of the single cell within the plurality of single cells is equal to the lower limit value of the range by proportional calculation, and sets the thus obtained value as the rate.

11. The battery control apparatus according to claim 1, wherein the permitted cell voltage data describes a correspondence relation between the close circuit voltage of the single cell within the plurality of single cells and the rate, and when the close circuit voltage of the single cell within the plurality of single cells is between the upper limit value and the lower limit value of the range, the control part sets the rate in accordance with the correspondence relation between the close circuit voltage of the single cell within the plurality of single cells and the rate, which is described in the permitted cell voltage data.

12. The battery control apparatus according to claim 1, wherein the storage part stores
an SOC table describing a corresponding relation between an open circuit voltage of the battery pack and a state of charge, and
a permitted power table describing a correspondence relation between the state of charge of the battery pack and the permitted power, and the control part
acquires a present state of charge of the battery pack by using the close circuit voltage of the battery pack and the SOC table, and
acquires the present permitted power of the battery pack by using the state of charge of the battery pack and the permitted power table.

* * * * *